(12) United States Patent
Gahl

(10) Patent No.: US 6,339,535 B1
(45) Date of Patent: Jan. 15, 2002

(54) DEVICE FOR FASTENING A PROTECTIVE COVERPLATE

(75) Inventor: Andreas Gahl, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/402,062

(22) PCT Filed: Mar. 5, 1998

(86) PCT No.: PCT/DE98/00655

§ 371 Date: Sep. 27, 1999

§ 102(e) Date: Sep. 27, 1999

(87) PCT Pub. No.: WO98/44770

PCT Pub. Date: Oct. 8, 1998

(30) Foreign Application Priority Data

Mar. 27, 1997 (DE) ..................... 297 05 621 U

(51) Int. Cl.$^7$ .................................. H05K 9/00
(52) U.S. Cl. .............. 361/801; 361/759; 361/800; 361/816; 206/719; 174/35 R
(58) Field of Search ................... 361/752, 753, 361/759, 801, 802, 800, 816, 818; 211/41.17; 206/719; 220/4.02; 174/35 R, 50

(56) References Cited

U.S. PATENT DOCUMENTS

| | | | | | |
|---|---|---|---|---|---|
| 4,811,168 A | * | 3/1989 | Chesnut et al. | ............... | 361/752 |
| 5,046,223 A | * | 9/1991 | Kraus | ........................... | 24/453 |
| 5,049,087 A | * | 9/1991 | Chung et al. | ................ | 439/289 |
| 5,191,513 A | * | 3/1993 | Sugiura et al. | .............. | 361/752 |
| 5,545,848 A | * | 8/1996 | Lin | ............................. | 174/52.1 |

FOREIGN PATENT DOCUMENTS

| | | |
|---|---|---|
| DE | 66 07 180 | 1/1971 |
| FR | 2 682 005 | 4/1993 |
| JP | 08 116195 A | 9/1996 |
| JP | 09 027358 A | 5/1997 |

* cited by examiner

Primary Examiner—Jayprakash N. Gandhi
(74) Attorney, Agent, or Firm—Schiff Hardin & Waite

(57) ABSTRACT

A device for fastening a shielding cover to a printed circuit board. A tension pin having end regions and a leaf spring in engagement with the tension pin act to press the shielding cover onto the printed circuit board wherein the end regions of the tension pin engage both the shielding cover and the printed circuit board.

5 Claims, 2 Drawing Sheets

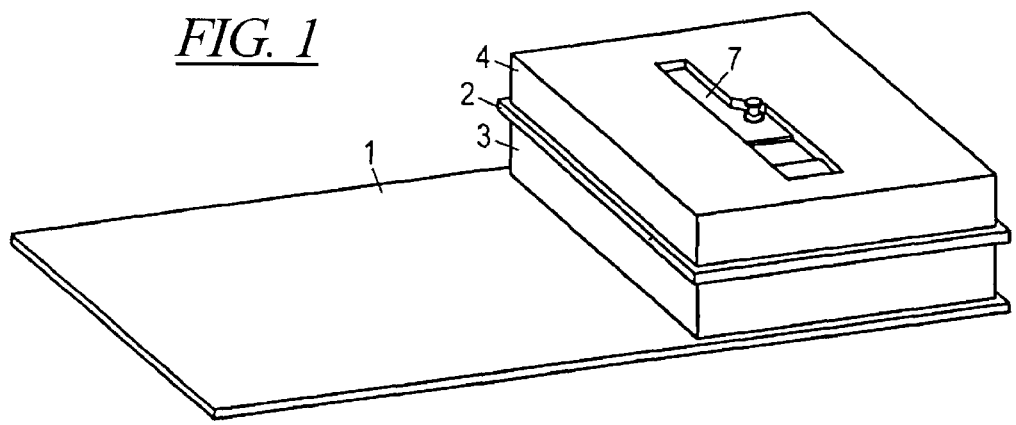
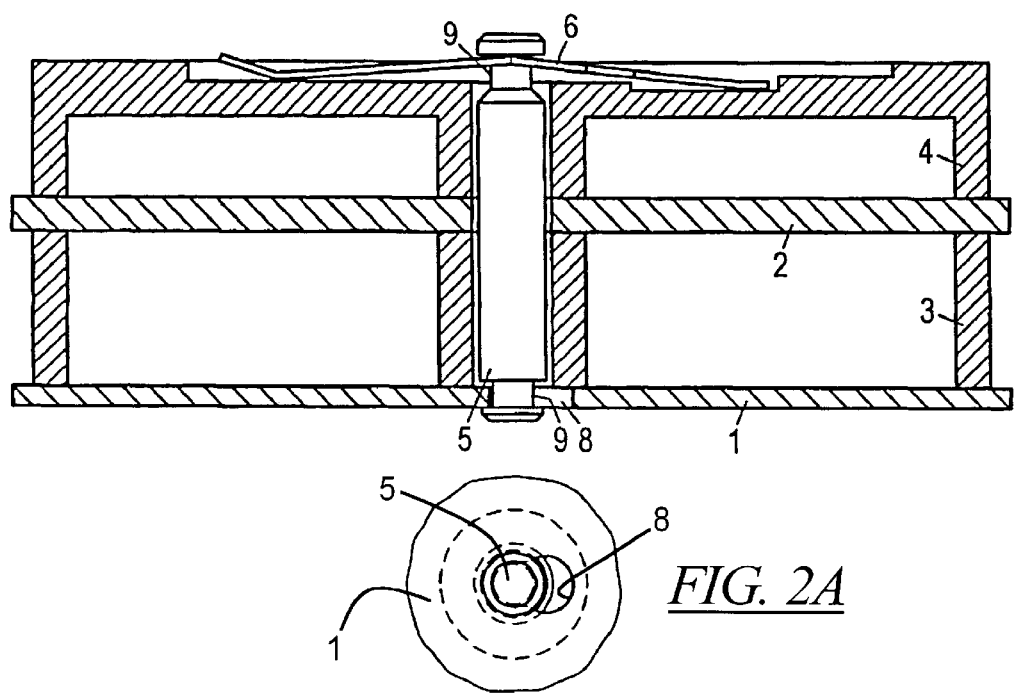

DEVICE FOR FASTENING A PROTECTIVE COVERPLATE

BACKGROUND OF THE INVENTION

Field of the Invention

The present invention is directed to a device for fastening a shielding cover on a region of a printed circuit board to be shielded.

There exists a specific need to electromagnetically shield certain component parts arranged on a printed circuit board. To meet the demands of this need, component parts are shielded with a shielding cover that is screwed onto the printed circuit board. In many instances, the shield cannot be screwed onto the printed circuit board of small devices, such as mobile radio telephone devices, because of space limitations under or behind the printed circuit board.

SUMMARY OF THE INVENTION

It is therefore an object of the present invention to provide a device for fastening a shield cover to printed circuit boards that are located in small devices.

The present invention provides a shielding cover that is pressed onto the printed circuit board with a leaf spring and a tension pin, wherein the tension pin has its end regions in engagement with both the printed circuit board and with the leaf spring.

Therefore, the space under or, respectively, behind the printed circuit board is not required for fastening.

The present invention further provides that the tension pin includes all round channels at its ends. An opening is provided in the printed circuit board having a slot adjoining thereto wherein the tension pin can have its lower channel inserted. Once inserted into the printed circuit board, the upper channel of the tension pin projects through an opening of the shielding cover when the shielding cover is put in place and is in engagement with a recess of the biased leaf spring. This embodiment is characterized by an especially simple construction.

DESCRIPTION OF THE DRAWINGS

FIG. 1 is a perspective view of a printed circuit board with a shielding cover secured in accordance with the principles of the present invention;

FIG. 2 is a side sectional view of the shielding cover secured on the printed circuit board;

FIG. 2A is a partial bottom plan view to show the connection of the pin in a keyhole slot of the circuit board.

DESCRIPTION OF THE PREFERRED EMBODIMENTS

Figure 3:
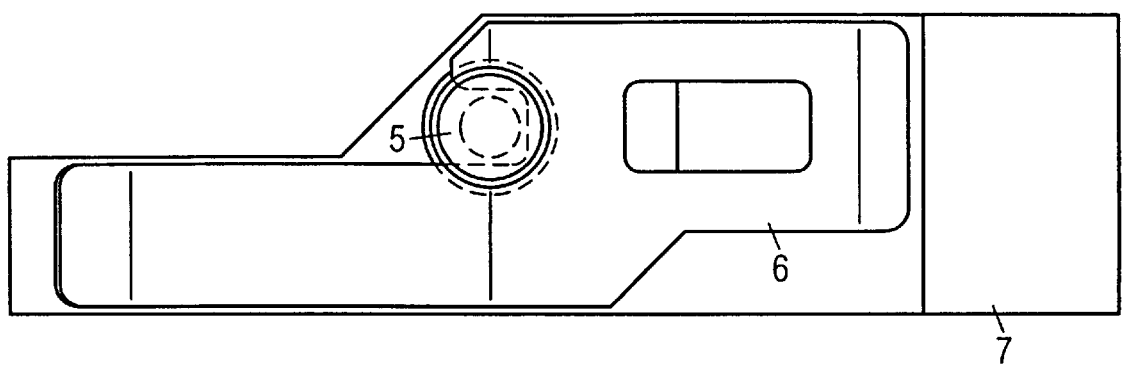
FIG. 3 is a partial top plan view of the shielding cover of the invention.

A tension pin 5 is provided that comprises all around channels 9 at its two ends. The printed circuit board 1 comprises an introduction hole 8 (see FIG. 2A) for the tension pin 5, which hole is located approximately in the middle of the region to be shielded. This introduction hole 8 is essentially a keyhole slot composed of an opening through which the tension pin 5 can be plugged and of a slot adjoining thereto wherein the tension pin 5 is introduced with its lower channel, so that the tension pin is fixed in a vertical direction on the board 1. The spacing between the channel 9 and the free, lower end of the tension pin 5 is minimal, so that minimal space is required for the lower end under or behind the printed circuit board 1, which is all of the space necessary for the attachment of a shielding cover 4.

In the illustrated embodiment, a shielding frame 3 is also provided between the shielding cover 4 and the printed circuit board 1, wherein an auxiliary printed circuit board 2 is attached between the shielding frame 3 and the shielding cover 4. It is to be pointed out here that the shielding frame 3 is not critical to the invention.

Just like the shielding cover 4, the shielding frame 3 also includes a guide for the tension pin 5 in the middle, so that the shielding frame 3 is also protected against an unintentional lateral movement.

A round channel 9 into which the recess of a leaf spring 6 is introduced is likewise attached to the upper end of the tension pin 5. The recess of the leaf spring engaging into the channel is implemented such that, in the inserted condition of the leaf spring 6, the engagement of the channel of the tension pin 5 with the leaf spring 6 occurs essentially in the middle of the leaf spring 6. The leaf spring 6 also includes two ends which are supported on the shielding cover 4. After the leaf spring 6 is attached to the end of the tension pin 5, the shielding cover 4 is, thus, secured on the printed circuit board 1.

It is thereby advantageous that, as a result of the fashioning of the leaf spring 6, a defined pressing power is exerted onto the shielding cover. Destruction of the printed circuit board 1 or of the shielding cover 4 due to the application of a force greater than the pressing power is thus prevented.

The pressing of the shielding frame 3 onto the printed circuit board 1 provides a specific and predetermined pressure corresponding to the force exerted by the leaf spring. What the inventive fastening device thus avoids is a destruction of either the shielding cover 4 or of the printed circuit board 1.

In an embodiment, as illustrated in FIG. 3, the leaf spring 6 can be inserted into a bellied or recessed portion 7 that is located on the surface of the shielding cover 4.

Although modifications and changes may be suggested by those skilled in the art, it is the intention of the inventors to embody with in the patent warranted hereon all changes and modifications as reasonably and properly come within the scope of their contribution to the art.

I claim:

1. A device comprising a printed circuit board having an opening therethrough, a shielding cover having an opening therethrough, a tension pin having an end received in the opening of the printed circuit board and another end extending through the opening of the shielding cover, and a spring engaging the other end of the tension pin and biasing the shielding cover against the printed circuit board.

2. A device according to claim 1, wherein each end of the tension pin has a channel, said opening in the circuit board having a slot extending thereto, said channel, at the one end, being engaged in said slot, the other end of the tension pin having the channel received in an opening of said leaf spring.

3. A device according to claim 2, wherein each of the channels is an annular channel.

4. A device according to claim 2, wherein the opening of the shielding cover has a guide extending inward therefrom for receiving the tension pin.

5. A device according to claim 1, wherein the opening of the shielding cover has a guide extending inward therefrom for the tension pin.

* * * * *